United States Patent [19]

Muraki

[11] Patent Number: 5,499,076
[45] Date of Patent: Mar. 12, 1996

[54] EXPOSURE METHOD AND APPARATUS

[75] Inventor: Masato Muraki, Inagi, Japan

[73] Assignee: Canon Kabushiki Kaisha, Tokyo, Japan

[21] Appl. No.: 449,918

[22] Filed: May 25, 1995

Related U.S. Application Data

[63] Continuation of Ser. No. 64,655, May 21, 1993, abandoned.

[30] Foreign Application Priority Data

May 21, 1992 [JP] Japan .................. 4-154500
Feb. 24, 1993 [JP] Japan .................. 5-061034

[51] Int. Cl.⁶ .................. G03B 27/42; G03B 27/52
[52] U.S. Cl. .................. 355/53; 355/71; 430/5
[58] Field of Search .................. 355/30, 53, 55, 355/71

[56] References Cited

U.S. PATENT DOCUMENTS

| | | | |
|---|---|---|---|
| 4,420,233 | 12/1983 | Nomoto et al. | 353/122 |
| 4,503,335 | 3/1985 | Takahashi | 250/548 |
| 4,506,977 | 3/1985 | Sato et al. | 355/56 |
| 4,666,273 | 5/1987 | Shimizu et al. | 353/101 |
| 4,669,842 | 6/1987 | Yomoda et al. | 353/101 |
| 4,687,322 | 8/1987 | Tanimoto et al. | 355/55 |
| 4,690,528 | 9/1987 | Tanimoto et al. | 353/101 |
| 4,699,505 | 10/1987 | Komoriya et al. | 355/30 |
| 4,704,348 | 11/1987 | Koizumi | 430/327 |
| 4,786,947 | 11/1988 | Kosugi et al. | 355/30 |
| 4,907,021 | 3/1990 | Yabu | 353/101 |
| 4,947,047 | 8/1990 | Muraki | 250/492.2 |
| 4,988,821 | 3/1991 | Ohta et al. | 353/122 |
| 5,025,284 | 6/1991 | Komoriya et al. | 355/53 |
| 5,234,780 | 8/1993 | Nitayama et al. | 430/5 |
| 5,275,894 | 1/1994 | Tanabe | 430/5 |
| 5,322,749 | 6/1994 | Han | 430/5 |
| 5,411,823 | 5/1995 | Okamoto | 430/5 |
| 5,442,714 | 8/1995 | Iguchi | 382/144 |

FOREIGN PATENT DOCUMENTS 62-50811 10/1987 Japan .

OTHER PUBLICATIONS

Levenson, et al., "Improving Resolution in Photolithography with a Phase-Shifting Mask," IEEE Transactions on Electron Devices, vol. ED-29, No. 12, Dec. 1982, pp. 1828 through 1836.

*Primary Examiner*—Michael L. Gellner
*Assistant Examiner*—Davis P. Malley
*Attorney, Agent, or Firm*—Fitzpatrick, Cella, Harper & Scinto

[57] ABSTRACT

Disclosed is an exposure method and apparatus for exposing a substrate by use of a pattern having a phase shift device, wherein the amount of phase shift with the phase shift device can be changed by changing the humidity of an ambient gas of the pattern.

4 Claims, 4 Drawing Sheets

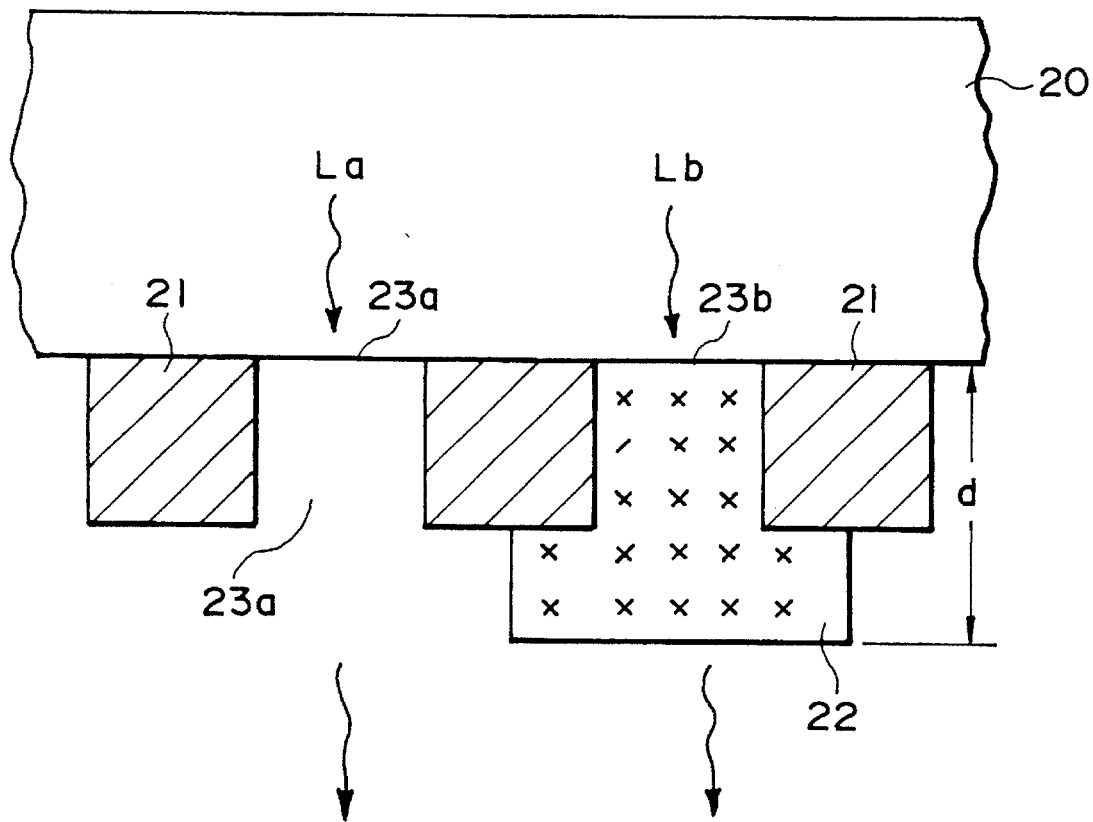
F I G. 2

EXPOSURE METHOD AND APPARATUS

This application is a continuation of prior application, Ser. No. 08/064,655 filed May 21, 1993, now abandoned.

FIELD OF THE INVENTION AND RELATED ART

This invention relates to an exposure method and apparatus. More particularly, the invention is concerned with an exposure method and apparatus usable for manufacture of microdevices such as semiconductor chips, liquid crystal panels, CCDs or magnetic heads, for example, through use of an original on which a phase shift film is formed. In another aspect, the invention may be concerned with a method of manufacturing such a microdevice, based on such an exposure method.

In an exposure apparatus for the manufacture of semiconductor devices, particularly an exposure apparatus called a "stepper", a reticle (photomask) having an electronic circuit pattern formed thereon is illuminated by an illumination system and an image of the electronic circuit pattern of the reticle is projected on a wafer through a projection lens system (wafer exposure).

In such a stepper, recent increases in the degree of integration of each semiconductor device has led to a need for higher fineness (resolution) of an image of a pattern projected by a projection lens system as well as a larger depth of focus.

An attempt to improve the fineness of a pattern image projected and the depth of focus is what can be called a "phase shift method" such as discussed in Japanese Patent Publication No. 50811/1987 or "Trans. of Electric Device" (IEEE, Vol. ED-29, No. 12(1982), page 1828).

The phase shift method uses a phase shift mask having a phase shift film, for enhanced resolution and contrast of a pattern image. The phase shift mask has an electronic circuit pattern which is defined by a transparent region and a non-transparent region. The transparent region is partially provided with a phase shift film. It serves to apply a certain phase difference (e.g. 180 deg.) to the light passing therethrough, as compared with light passing the other portion.

SUMMARY OF THE INVENTION

When a phase shift film is used to apply a certain phase difference (e.g. 180 deg.) to a portion of a transparent region in order to attain enhanced resolution and depth of focus, any error in the phase difference applied should be within a range of about ±10 deg. If the error is over ±10 deg., a change in the focal point position causes a change in size of the pattern, thus reducing the effect of improving the depth of focus.

For applying a phase difference, a transparent film (phase shift film) having a refractive index different from that of the ambience (air) may be provided in a portion of a transparent region. When the refractive index of the transparent film is $n_f$, the thickness of the film is d and the wavelength of exposure light used is $\lambda$, then the phase difference $\Delta$(deg.) to be applied is given by:

$$\Delta = 360 \times [(n_f - 1) \cdot d]/\lambda \tag{1}$$

Clearly from equation (1) and since the wavelength $\lambda$ of the exposure light is constant, the error in phase difference applied changes with the thickness d and the refractive index $n_f$ of the transparent film.

It is accordingly an object of the present invention to provide an exposure method by which an enhanced phase shift effect is assured.

It is another object of the present invention to provide an exposure apparatus based on such an exposure method.

In accordance with a first aspect of the present invention, there is provided an exposure method for exposing a substrate by use of a pattern having a phase shift means, wherein the amount of phase shift with the phase shift means can be changed by changing the humidity of an ambient gas of the pattern.

In accordance with a second aspect of the present invention, there is provided an exposure method for exposing a substrate by use of a pattern having a phase shift means, wherein the amount of phase shift with the phase shift means can be changed by changing the pressure of an ambient gas of the pattern.

In accordance with a third aspect of the present invention, there is provided an exposure method for exposing a substrate by use of a pattern having a phase shift means, wherein the amount of phase shift with the phase shift means can be changed by changing the temperature of an ambient gas of the pattern.

In accordance with a fourth aspect of the present invention, there is provided an exposure method for exposing a substrate by use of a pattern having a phase shift means, wherein the amount of phase shift with the phase shift means can be changed by controlling an ambient gas of the pattern.

The phase shift means may comprise a phase shift film applied to a substrate, or a phase shift producing structure (surface step) defined by etching the substrate.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 2 is an enlarged view for schematically showing a portion of a reticle used in the FIG. 1 apparatus.

DESCRIPTION OF THE PREFERRED EMBODIMENTS

Figure 1:
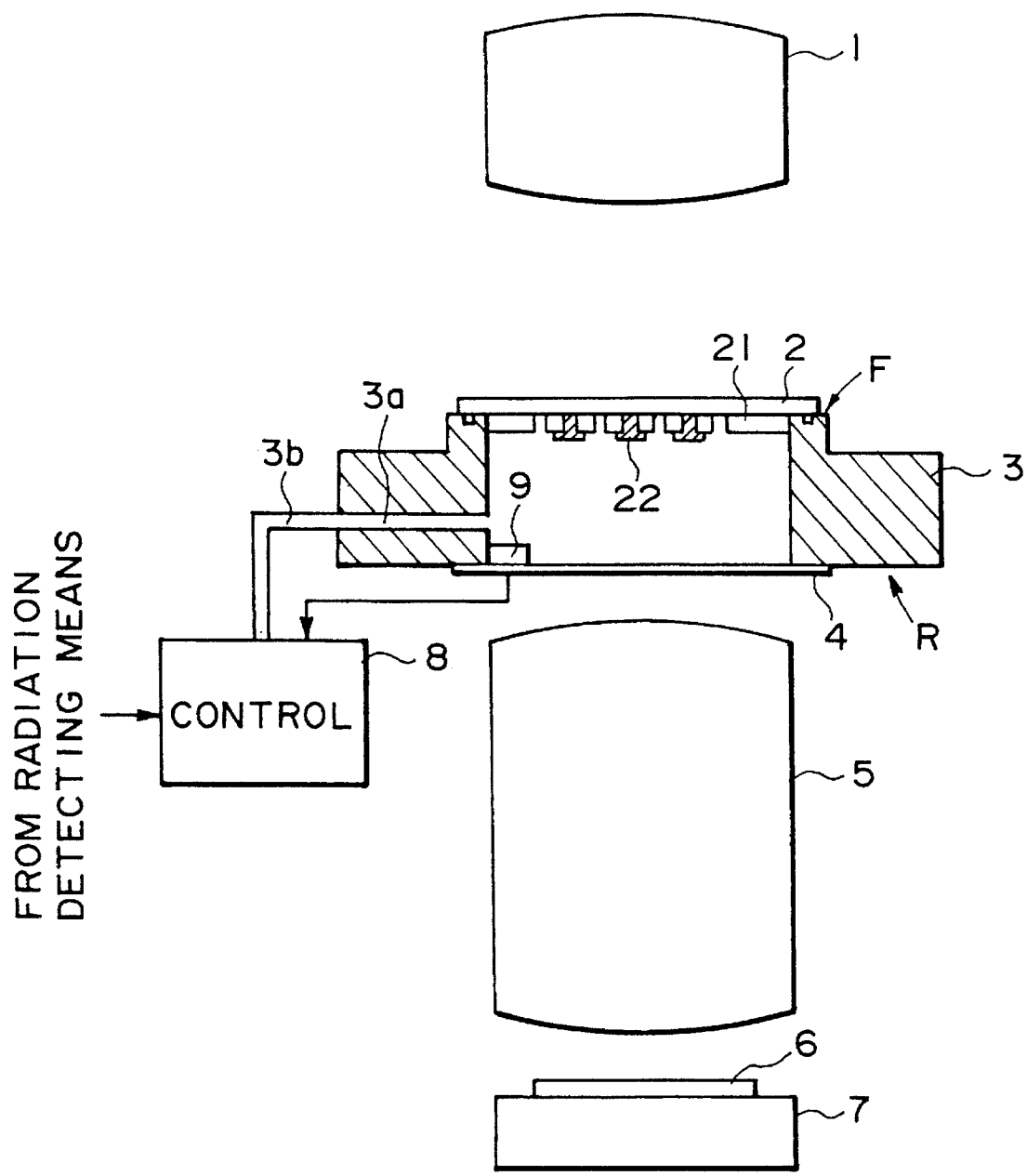
FIG. 1 is a schematic view of a projection exposure apparatus of an embodiment of the present invention.

Referring to FIG. 1 showing an embodiment of the present invention, denoted at 1 is an illumination system for illuminating with exposure light a reticle 2 having a pattern formed in accordance with the phase shift method, to be described later.

Although not shown in FIG. 1, the illumination system 1 is provided with a means for detecting the radiation energy (light quantity) of the exposure light, irradiating the reticle 2. The detected light is inputted to a humidity control means 8, to be described later.

The reticle 2 comprises a transparent glass substrate on which an electronic circuit pattern is formed by using a light blocking material such as chromium (Cr). The electronic circuit pattern is defined by a transparent region for transmitting the exposure light from the illumination system 1 as well as a non-transparent region provided by the light blocking material (e.g. chromium). The light transparent region is partially provided with a phase shift film 22 for applying a certain phase difference (e.g. 180 deg.) to the light passing through the film, as compared with the light passing through the other portion. A phase shift mask is thus provided.

Denoted at 3 is a reticle stage for carrying thereon a reticle 2. Formed in a portion of the reticle stage 3 is an air duct 3a which is communicated with a humidity controlling means 8 through a connection 3b.

Among the temperature, pressure and humidity of the ambient gas, the humidity most strongly affects the refractive index $n_f$ of the phase shift film. In consideration of this, this embodiment uses a humidity controller as the controlling means 8. Seal glass 4 is provided on the surface R of the reticle stage 3 which is at the side remote from the surface F on which the reticle 2 is placed. The seal glass 4 is effective to close and isolate, from the outside gas, the space 10 (ambience) at the side of the reticle 2 surface on which the electronic circuit pattern is formed.

Denoted at 9 is a humidity detector for detecting humidity in the space 10 to which the phase shift film 22 faces. The detected humidity is signaled to the humidity controller 8. On the basis of the signal from the humidity detector 9 and a signal representing the irradiation energy (exposure hysteresis) applied to the phase shift mask from the illumination system 1, the humidity controlling means 8 serves to control the humidity within the space 10 by blowing dry air or steam into the space 10. This is done to adjust the amount of phase shift through the phase shift film to a desired amount (e.g. 180 deg.).

Denoted at 5 is a projection lens system for projecting in a reduced scale the electronic circuit pattern of the reticle 2 onto the surface of a wafer 6, for manufacture of semiconductor devices. The wafer 6 has a photoresist applied onto its surface, and it is placed on a wafer stage 7 which is able to be driven in X, Y, Z and θ directions. The wafer stage 7 is adapted to be moved stepwise so as to assure that the electronic circuit pattern of the reticle 2 is imaged on each of different zones of the wafer 6 surface.

Now, the feature of controlling the humidity in the space in which the phase shift film is provided, to thereby apply a desired phase difference to the light passing therethrough, will be explained in detail.

FIG. 2 is an enlarged view of a portion of the reticle 2 surface in which the phase shift film 22 is provided.

In the drawing, denoted at 20 is a transparent glass substrate, and denoted at 23a and 23b are transparent regions. Denoted at 21 are non-transparent regions (light blocking film), being formed on the substrate 20 to define an electronic circuit pattern. Phase shift film 22 is applied to the transparent region 23b so as to provide a phase shift difference of about 180 deg. to the light passing through the portion 23b, as compared with the light passing through the transparent region 23a. A phase shift film is thus provided.

There is a phase difference between the light passed through the transparent region 23a and the light passed through the transparent region 23b, which difference is determined in accordance with equation (1) mentioned above. The phase shift film 22 comprises a film substrate portion (like bulk) and a clearance portion. The refractive index $n_f$ of the phase shift film 22 is expressed by:

$$n_f = n_o p + n(1-p) \quad (2)$$

where $n_o$ is the refractive index of the film substance portion, n is the refractive index of the ambience gas filling the clearance portion (in vacuum or dry air, n=1.0; in saturated water vapor, n=1.33), and p is the bulk density of the phase shift film which can be defined as the proportion of the film substance portion to the total volume of the film including the clearance portion. Usually, p=0.8 to 0.9. Depending on the humidity, the refractive index n of the ambience gas filling the clearance space changes largely, from 1.0 to 1.33. Thus, the refractive index $n_f$ of the phase shift film changes largely with a change in humidity.

For example, in FIG. 2, the phase difference between the light La passed through the transparent region 23a and the light Lb passed through the transparent region 23b changes with the humidity of the ambient gas, in the following manner.

On an occasion when the wavelength λ of the light is λ=365 nm, the refractive index $n_o$=1.0, the bulk density p=0.8, and the space 10 being filled with dry air of n−1.0, and if the phase difference Δ to be applied by the phase shift film of a phase shift film used is Δ=108 deg., then the refractive index $n_f$ of the phase shift film is given, in accordance with equation (2), as follows:

$$n_f = 1.5 \times 0.8 + 1 \times (1-0.8) = 1.4$$

Also, from equation (1), the thickness d of the phase shift film is:

$$d = (180/360) \times [365/(1.4-1)]32\ 456.25\ (nm)$$

If this phase shift mask is placed within an ambient gas of saturated water vapor (n=1.33), then from equation (2) the refractive index $n_f$ changes to:

$$n_f = 1.466$$

Also, in accordance with equation (1), the phase difference Δ between the light La and the light Lb changes as follows:

$$\Delta = 360 \times [(1.466-1)/365] \times 456.25 = 209.7\ (deg)$$

Thus, with a change in ambience such as above, there is caused a large deviation of about 30 deg. from the desired phase difference of 180 deg. It is therefore seen that in an exposure apparatus it is important to preset the ambience (particularly, the humidity) in which the phase shift mask is used and to maintain the preset humidity.

Essentially, it is important to control the humidity in the film clearance portion. This is because: the phase shift film of the phase shift mask is not completely transparent and, therefore, there is a small absorption; as a consequence, heat is locally generated in the phase shift film in response to irradiation of the film with exposure light, which causes a change in humidity in the film clearance portion in a manner different from the humidity change in the ambient gas. The change in humidity has a relation with the exposure hysteresis such as the time period of application of the exposure energy to the phase shift mask or the exposure energy applied to the mask per unit time.

In the present embodiment, as shown in FIG. 1, the humidity in the space 10 to which the phase shift film 22 is exposed is controlled to and maintained at a predetermined level by using the humidity detector 9 and the humidity controlling means 8, such that an appropriate phase difference is applied between the passed light La and the passed light Lb regardless of any change in ambient humidity.

In this embodiment as shown in FIG. 1, the humidity controlling means controls the humidity in the space 10 to which the phase shift film 22 is exposed, on the basis of the signal from the humidity detector 9 as well as the information regarding hysteresis of exposure energy applied to the phase shift mask from the illumination system 1, to thereby control in substance the humidity in the film clearance portion.

With the arrangement described above, enhancement of resolution of a pattern image and enlargement of depth of focus are assured in the present embodiment.

While in the present embodiment the humidity in the space to which the phase shift film is exposed is controlled, as an alternative the humidity in a chamber which accommodates therein the exposure apparatus as a whole may be controlled.

Also, while the present embodiment is arranged to control the humidity of ambient gas (among the temperature, pressure and humidity), a known type temperature controlling means or pressure adjusting means may be used to control the temperature or pressure of the ambient gas. Of course, two or more of the temperature, humidity and pressure may be controlled.

The present invention is applicable to a proximity type exposure apparatus wherein a phase shift mask and a wafer are lithographically processed with a small gap maintained therebetween, or a contact type exposure apparatus wherein the mask and the wafer are maintained in contact with each other. Further, the invention is applicable to a projection exposure apparatus of the type that the projection system comprises a projection mirror system or a combination of a lens system and a mirror system.

Next, a method of manufacturing semiconductor devices by using an exposure apparatus such as described above, will be explained.

Figure 3:
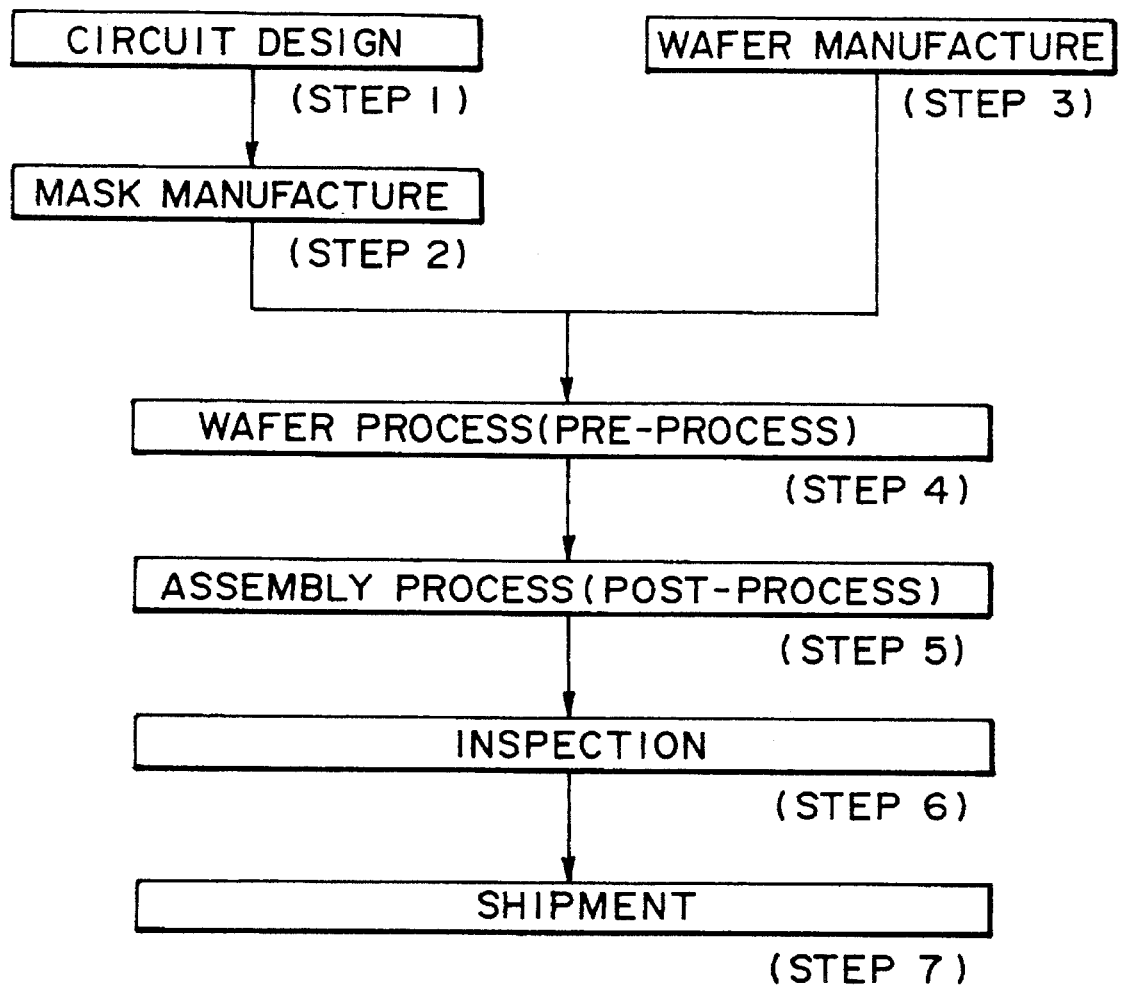
FIG. 3 is a flow chart for explaining semiconductor device manufacturing processes.

FIG. 3 is a flow chart of the sequence of manufacturing a semiconductor device such as a semiconductor chip (e.g. IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein an operability check, a durability check and so on of the semiconductor devices produced by step 5 are carried out. With these processes, semiconductor devices are finished and they are shipped (step 7).

Figure 4:
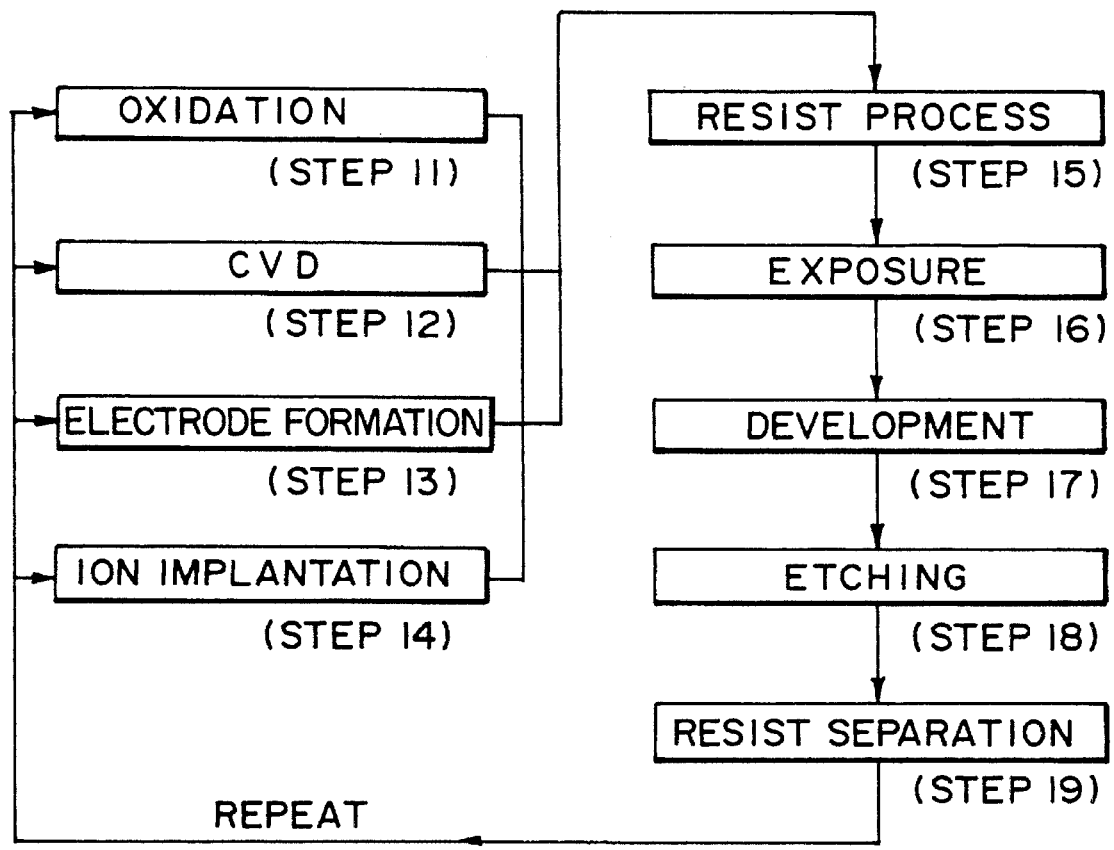
FIG. 4 is a flow chart for explaining details of a wafer process.

FIG. 4 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

In accordance with these embodiments of the present invention, when a phase shift mask based on the phase shift method is used to print a pattern on a wafer, the condition or conditions (particularly, humidity) of the ambient gas for the phase shift film is controlled in the manner such as described above, by which the phase difference to be applied by the mask or reticle can be adjusted in the exposure apparatus in which the mask is used. Therefore, it is possible to provide a phase difference which is maintained stably for a long period. Thus, the present invention assures an exposure apparatus and/or a device manufacturing method by which a high resolution pattern image can be provided easily.

Further, if the relationship between the humidity and the refractive index of the phase shift film, for example, is predetected, then it is possible to correct any deviation of phase difference due to an error in the thickness of the phase shift film during manufacture of the mask or reticle, by controlling the humidity, for example, within the exposure apparatus. Thus, the required precision for the film thickness control in the manufacture of the reticle can be reduced and, as a consequence, it is possible to attain enhanced yield of reticle manufacture.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus for projecting a pattern of a reticle using phase shift means onto a substrate, said apparatus comprising:

an optical system for projecting the pattern of the reticle onto the substrate;

control means for adjusting a refractive index of the phase shift means to control the quantity of phase shift provided by the phase shift means.

2. An apparatus according to claim 1, further comprising means for defining a closed space at the phase shift means side of the reticle, which space accommodates the phase shift means therein, wherein said control means changes humidity of a gas in the closed space to change the refractive index of the phase shift means.

3. A device manufacturing method which includes projecting a pattern of a reticle onto a substrate, said method comprising the steps of:

providing the reticle with phase shift means; and adjusting a refractive index of the phase shift means of the reticle to provide a desired quantity of phase shift by the phase shift means.

4. A method according to claim 3, wherein said adjusting step comprises adjusting humidity of the gas which is contained in a closed space at the phase shift means side of the reticle.

* * * * *

UNITED STATES PATENT AND TRADEMARK OFFICE
CERTIFICATE OF CORRECTION

PATENT NO. : 5,499,076
DATED : March 12, 1996
INVENTOR(S) : Masato MURAKI

It is certified that error appears in the above-indentified patent and that said Letters Patent is hereby corrected as shown below:

COLUMN 1:

Line 33, "Electric Device" should read --Electron Devices--.

COLUMN 4:

Line 17, "n-1.0," should read --n=1.0,--; and
Line 28, "d=(180/360)x[365/(1.4-1)32 456.25 (nm)" should read --$d$=(180/360)x[365/(1.4-1)]=456.25 (nm)--.

COLUMN 5:

Line 2, "hysteresis" should read --the hysteresis--; and
Line 11, "alternative" should read --alternative,--.

UNITED STATES PATENT AND TRADEMARK OFFICE
CERTIFICATE OF CORRECTION

PATENT NO. : 5,499,076
DATED : March 12, 1996
INVENTOR(S) : Masato MURAKI

It is certified that error appears in the above-indentified patent and that said Letters Patent is hereby corrected as shown below:

COLUMN 6:

Line 40, "substrate;" should read --substrate; and--.

Signed and Sealed this

Thirtieth Day of July, 1996

Attest:

BRUCE LEHMAN

*Attesting Officer*        Commissioner of Patents and Trademarks